(12) United States Patent
Fukuda et al.

(10) Patent No.: US 9,148,953 B2
(45) Date of Patent: Sep. 29, 2015

(54) GLASS WIRING BOARD

(71) Applicant: Tyco Electronics Japan G. K., Kanagawa-Ken (JP)

(72) Inventors: Katsunori Fukuda, Kanagawa (JP); Akira Torigoe, Tokyo (JP)

(73) Assignee: Tyco Electronics Japan G.K., Kanagawa-ken (JP)

( * ) Notice: Subject to any disclaimer, the term of this patent is extended or adjusted under 35 U.S.C. 154(b) by 0 days.

(21) Appl. No.: 14/046,408

(22) Filed: Oct. 4, 2013

(65) Prior Publication Data

US 2014/0097005 A1    Apr. 10, 2014

(30) Foreign Application Priority Data

Oct. 5, 2012 (JP) ................. 2012-223451

(51) Int. Cl.
*H05K 1/03* (2006.01)
*H05K 3/24* (2006.01)
*H05K 3/38* (2006.01)

(52) U.S. Cl.
CPC .............. *H05K 1/0306* (2013.01); *H05K 3/246* (2013.01); *H05K 3/387* (2013.01); *H05K 2201/0212* (2013.01); *H05K 2201/0215* (2013.01); *H05K 2201/0239* (2013.01)

(58) Field of Classification Search
CPC ..... H05K 1/0306; H05K 3/387; H05K 3/246; H05K 2201/0212; H05K 2201/0215; H05K 2201/0239; H05K 3/389
USPC ................... 174/250–268; 361/760, 792–795
See application file for complete search history.

(56) References Cited

U.S. PATENT DOCUMENTS

| | | | | |
|---|---|---|---|---|
| 5,322,976 | A * | 6/1994 | Knudsen et al. | 174/262 |
| 6,339,197 | B1 * | 1/2002 | Fushie et al. | 174/262 |
| 6,717,048 | B2 * | 4/2004 | Ueda et al. | 174/389 |

FOREIGN PATENT DOCUMENTS

| | | |
|---|---|---|
| JP | 08-176835 | 7/1996 |
| JP | 2002-068782 | 3/2002 |
| JP | 2005-243991 | 9/2005 |

OTHER PUBLICATIONS

Machin translation of Japanese Publication No. JP2002-068782, published on Mar. 8, 2002.*

* cited by examiner

*Primary Examiner* — Ishwarbhai B Patel
(74) *Attorney, Agent, or Firm* — Barley Snyder

(57) ABSTRACT

A glass wiring board is provided that includes a glass substrate and a primer layer. The prime layer is disposed on the glass substrate and includes an intermediate layer and a copper plating layer disposed on the intermediate layer. The intermediate layer includes a resin coupling agent and a metal element dispersed in the resin coupling agent.

16 Claims, 1 Drawing Sheet

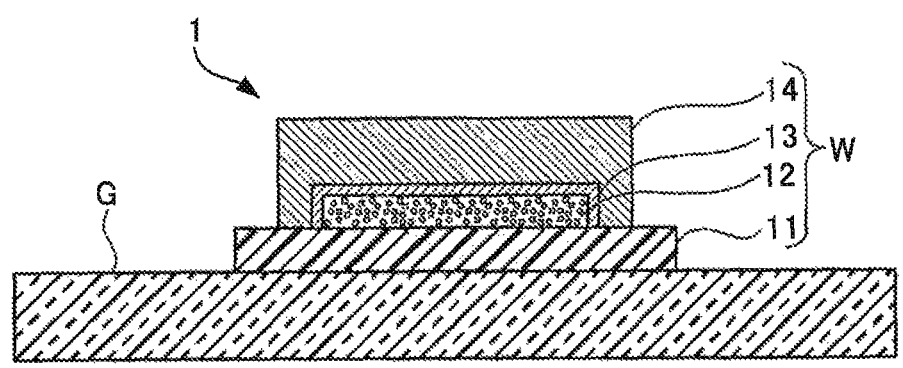

GLASS WIRING BOARD

CROSS-REFERENCE TO RELATED APPLICATIONS

This application claims the benefit of the filing date under 35 U.S.C. §119(a)-(d) of Japanese Patent Application No. 2012-223451 filed on Oct. 5, 2012.

FIELD OF THE INVENTION

The present invention relates to a wiring board, and, in particular, to a glass wiring board.

BACKGROUND

Glass wiring boards having conductor patterns that are formed on a glass substrate are known. For example, Japanese Patent Publication, JP 2002-68782A discloses a glass board having a silane coupling agent adhered on a surface of a glass board. A plurality of fine metal particles are secured using the silane coupling agent, and a plating is applied to form electrical wiring. The electrical wiring is selectively arranged on the glass board by an exposed resist.

It is desirable that the wiring along a unit length have low electrical resistance. For example, it is required to reduce electrical resistance in order to lower loss and characteristics degradation for wiring for an antenna (i.e. near field communication or a wiring for electrical power supply).

However, in a case in which a thick copper plating layer is used in order to reduce electrical resistance, the copper plating layer may be peeled off when mechanical stress is applied. This also applies to the method of JP 2002-68782A in which the metal particles are fixed using a fine layer of silane coupling molecules.

Here, a silver paste may be interposed which can be applied comparatively thick. However, in a case in which the silver paste is provided on a glass, there is a possibility during plating that the silver plating may peel off from an edge portion when plating solution is disposed between the glass and the silver in the silver paste.

SUMMARY

In view of the foregoing problems, the present invention has been made to provide a glass wiring board in which electrical resistance of a conductor is reduced and also peeling off of the conductor is prevented.

The glass wiring board includes a glass substrate and a primer layer. The prime layer is disposed on the glass substrate and includes an intermediate layer and a copper plating layer disposed on the intermediate layer. The intermediate layer includes a resin coupling agent and a metal element dispersed in the resin coupling agent.

BRIEF DESCRIPTION OF THE DRAWINGS

The above and other features of the present invention will become more apparent by describing in detail exemplary embodiments thereof with reference to the accompanying drawings, in which:

FIG. 1 is a sectional view of a glass wiring board according to the invention.

DETAILED DESCRIPTION OF THE EMBODIMENT(S)

An embodiment of the glass wiring board according to the invention will be described with reference to the referenced Figure.

As shown in FIG. 1, a glass wiring board 1 according to the includes a glass substrate G and an electrical wiring W. For example, the glass wiring board 1 may function as a casing foe a mobile device (not illustrated), and the electrical wiring W functions as an antenna element or an electrical wiring provided inside the casing. For example, the electrical wiring W may function as an antenna element for near field communication or a wiring for electrical power, electric current for supplying electric power flows in the electrical wiring W. Thus, low electrical resistance is required for the electrical wiring W, in order to reduce an electrical power loss.

The glass substrate G is chemically tempered glass. More specifically, the glass substrate G is formed through chemical processing in which a part of sodium ions distributed near a surface of an aluminosilicate glass is substituted with potassium ions. Comparing to, for example, an aluminosilicate glass, the glass substrate G is difficult to be damaged by a shock when dropped and so on.

In the shown embodiment, the electrical wiring W includes a primer layer 11, an intermediate layer 12, a nickel plating layer 13 and a copper plating layer 14.

The primer layer 11 is a layer disposed on the glass substrate G. The primer layer 11 may include resin. More specifically, the primer layer 11 includes a resin and an additive of silane-based compound. The resin is, for example, epoxy-based resin, acrylic silicone or urethane-based resin. In an exemplary embodiment, the thickness of the primer layer 11 is 0.5 μm or more and 10 μm or less. The thickness of the primer layer 11 may be 2 μm or more in order to improve the impact resistance performance, while a thickness of 5 μm or more may facilitate ease in pad printing. The primer layer 11 may be disposed on the glass substrate G by applying a primer paste, including resin and silane-based compound, and then allowing the primer paste to harden.

The intermediate layer 12 is disposed on the primer layer 11. The intermediate layer 12 may include a resin coupling agent and metal element, such as silver or copper, which is dispersed in the resin coupling agent. More specifically, in an exemplary embodiment, the intermediate layer 12 is obtained by hardening a low temperature hardened type silver (or copper) paste through a low temperature hardening processing. The low temperature hardened silver (or copper) paste may include epoxy-based resin, phenol-based resin, ester-based resin or a mixture of them as a binder, and particles of silver (or copper) as a filler. The low temperature hardening processing refers to hardening by heating under approximate 150° C. or lower. In an exemplary embodiment, the intermediate layer 12 has the thickness of 0.1 μm or more and 5 μm or less.

Here, among materials similar to the low temperature hardening silver paste used in the exemplary embodiment, there is a silver paste of burning type. However, the silver paste of burning type is required to be sintered at 600° C. or higher. At a high temperature of approximate 300° C. or higher, potassium ions are separated from the glass substrate G, and as a result, the strength of the glass substrate G is significantly degraded. Since the intermediate layer 12 in the exemplary embodiment is formed through hardening, by heating the low temperature hardening silver paste at low temperature under approximate 150° C. or lower, the strength of the glass substrate G is not degraded.

The nickel plating layer 13 is disposed on the intermediate layer 12. More specifically, the nickel plating layer 13 is a strike plating layer, and has the thickness of 0.01 μm or more and 1.0 μm or less in an exemplary embodiment of the invention. The nickel plating layer 13 is formed through electroless nickel plating.

The copper plating layer 14 is disposed on the nickel plating layer 13. More specifically, the copper plating layer 14 is formed through electroless copper plating, and has the thickness of 5 μ, or more and 50 μm or less. For this reason, the electrical wiring W including the copper plating layer 14 has electrical resistance small enough to be used for an antenna for near field communication or for a wiring for electrical power supply.

Since the nickel plating layer 13 is interposed between the intermediate layer 12 and the copper plating layer 14, adhesion between the intermediate layer 12 and the copper plating layer 14 is increased, compared to a case in which the nickel plating layer 13 is not provided.

The glass wiring board 1 shown in FIG. 1 is manufactured as described.

First, primer ink for forming the primer layer 11 is applied by pad printing and the like. The primer layer 11 is formed wider than dimensions and shape of the copper plating layer 14 when the glass substrate is viewed from above (in a plan view). Incidentally, the primer layer 11 may be formed all over the glass wiring board 1. Next, a layer of silver (or copper) paste is applied on the primer layer 11 through pad printing or the like. The layer of silver (or copper) paste is formed according to a wiring when the glass wiring board 1 is viewed from above. Next, the silver (or copper) paste is heated to be hardened. The heating temperature is 150° C. or lower. The silver (or copper) paste is hardened so that the intermediate layer 12 is formed. Next, the nickel plating layer 13 is formed on the intermediate layer 12 through electroless nickel plating. Next, the copper plating layer 14 is formed on the nickel plating layer 13 through electroless copper plating. Since manufacturing for the glass wiring board 1 are performed under an environment of 150° C. or lower, the strength of the glass substrate G is not degraded.

In the electrical wiring W included in the glass wiring board 1, the primer layer 11 whose main component is resin is formed on the glass substrate G. The primer layer 11 has coefficient of elasticity larger than each of those of the intermediate layer 12, the nickel plating layer 13 and the copper plating layer 14. More than that, since the primer layer 11 has the thickness of 0.5 μm or more, it is possible that the primer layer 11 may absorb a force applied to the copper plating layer 14 of the top layer by elastic deformation. Hence, the electrical wiring W may not become displaced from the glass substrate G.

In an exemplary embodiment of the invention, the intermediate layer 12 has a thickness of 0.1 μm or more. The intermediate layer 12 comes into contact with plating solution in the electroless plating processing for forming the copper plating layer 14 of the manufacturing of the glass wiring board 1. At this time, the intermediate layer 12 is eroded by the plating solution. If the thickness of the intermediate layer is less than 0.1 μm, since the effect of erosion is large, the intermediate layer may be displaced from the glass substrate G. Specifically, in a case where the copper plating layer 14 has a thickness of 5 μm or more, the intermediate layer may be displaced from an underlying layer. In contrast to this, since the intermediate layer 12 according to the invention has the thickness of 0.1 μm or more, even if the copper plating layer 14 having the thickness of 5 μm or more is formed, the erosion by the plating solution is reduced. Accordingly, displacement of the intermediate layer 12 is prevented.

In addition, since the intermediate layer 12 is disposed on the primer layer 11, whose main component is resin, the metal in the intermediate layer 12 does not make contact with the glass substrate G. For this reason, an event in which the plating solution enters from a contact portion between the metal and the glass in the plating processing is prevented. Accordingly, in the glass wiring board 1 according to the invention, displacement of the intermediate layer 12 is reduced, compared to a configuration in which an intermediate layer is formed directly on a glass substrate.

The thickness of the primer layer 11 according to the exemplary embodiment is 0.5 μm or more and 10 μm or less, and the thickness of the intermediate layer is 0.1 μm or more and 5 μm or less. For this reason, the primer layer 11 and the intermediate layer 12 can be disposed by pad printing. Accordingly, electrical wiring having low electrical resistance can be positioned where it is generally difficult to be performed by screen printing, such as a concave of a glass substrate which concave is formed in a curved surface shape.

Incidentally, in the above-described embodiment, as an example of the glass substrate G according to the invention, the glass substrate G functions as a casing from a mobile device is described. However, the present invention is not limited to this. The glass substrate may be, for example, a circuit board to be provided inside other equipment.

In addition, in the above-described embodiment, as an example of the wiring in the glass substrate G according to the invention, the electrical wiring W for an antenna element or for electrical power supply is described. However, the present invention is not limited this. The wiring W in the glass substrate G may be a wiring other than one for an antenna element or for power supply.

In addition, in the above-described embodiment, as an example of the glass substrate G according to the invention, the glass substrate G which is tempered glass is described. However, the present invention is not limited this. The glass substrate G may be, for example, soda-lime glass, which is not subjected to tempering processing.

In addition, in the above-described embodiment, as examples of the nickel plating layer 13 and the copper plating layer 14 according to the invention, the nickel plating layer 13 and the copper plating layer 14, which are formed through electroless plating, are described. However, the present invention is not limited to this. The nickel plating layer 13 and the copper plating layer may 14 be, for example, formed through electroplating.

Further, in the above-described embodiment, the glass wiring board 1 including the nickel plating layer 13 is described. However, the glass wiring board 1 according to the invention may be one in which a copper plating layer 14 is formed on an intermediate layer 12 without a nickel plating layer 13.

Furthermore, in the above-described embodiment, the thickness for each example of the layers according to the invention is described. However, the thickness for each of the layers according to the invention is not limited this.

What is claimed is:

1. A glass wiring board comprising:
 a glass substrate;
 a primer layer disposed on the glass substrate and having a thickness of 0.5 μm or more and 10 μm or less;
 an intermediate layer having a resin coupling agent and a metal element dispersed in the resin coupling agent;
 a nickel plating layer disposed on the intermediate layer; and,
 a copper plating layer disposed on the nickel plating layer.

2. The glass wiring board according to claim 1, wherein the copper plating layer is disposed on a top portion of the intermediate layer.

3. The glass wiring board according to claim 1, wherein the copper plating layer is disposed on a side portion of the intermediate layer.

4. The glass wiring board according to claim 1, wherein the metal element is silver or copper.

5. The glass wiring board according to claim 1, wherein the nickel plating layer is disposed between the copper plating layer and the intermediate layer.

6. The glass wiring board according to claim 1, wherein the nickel plating layer has a thickness of 0.01 μm or more and 1.0 μm or less.

7. The glass wiring board according to claim 1, wherein a thickness of the intermediate layer is 0.1 μm or more and 5 μm or less.

8. The glass wiring board according to claim 7, wherein the nickel plating layer has a thickness of 0.01 μm or more and 1.0 μm or less.

9. The glass wiring board according to claim 8, wherein the nickel plating layer is a strike plating layer.

10. The glass wiring board according to claim 7, wherein the copper plating layer has a thickness of 5 μm or more and 50 μm or less.

11. The glass wiring board according to claim 1, wherein the glass substrate is chemically tempered glass.

12. The glass wiring board according to claim 1, wherein the primer layer includes an additive of a silane-based compound.

13. The glass wiring board according to claim 1, wherein the intermediate layer includes a low temperature hardened silver paste.

14. The glass wiring board according to claim 13, wherein the low temperature hardened silver paste includes an epoxy-based resin, a phenol-based resin, or an ester-based resin and particles of a silver filler.

15. The glass wiring board according to claim 1, wherein the intermediate layer includes a low temperature hardened copper paste.

16. The glass wiring board according to claim 15, wherein the low temperature hardened copper paste includes an epoxy-based resin, a phenol-based resin, or an ester-based resin and particles of a copper filler.

* * * * *